US012708042B2

(12) United States Patent
Kirby

(10) Patent No.: US 12,708,042 B2
(45) Date of Patent: Aug. 11, 2026

(54) SEMICONDUCTOR DEVICE WITH VOLUMETRICALLY-EXPANDED SIDE-CONNECTED INTERCONNECTS

(71) Applicant: Micron Technology, Inc., Boise, ID (US)

(72) Inventor: Kyle K. Kirby, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 379 days.

(21) Appl. No.: 18/237,225

(22) Filed: Aug. 23, 2023

(65) Prior Publication Data

US 2024/0071970 A1 Feb. 29, 2024

Related U.S. Application Data

(60) Provisional application No. 63/401,684, filed on Aug. 28, 2022.

(51) Int. Cl.

| | |
|---|---|
| ***H10W 90/00*** | (2026.01) |
| ***H10W 80/00*** | (2026.01) |
| ***H10W 90/20*** | (2026.01) |
| ***H10W 90/26*** | (2026.01) |
| *H10W 72/90* | (2026.01) |

(52) U.S. Cl.

CPC .......... *H10W 90/00* (2026.01); *H10W 72/923* (2026.01); *H10W 72/952* (2026.01); *H10W 80/011* (2026.01); *H10W 80/102* (2026.01); *H10W 80/312* (2026.01); *H10W 80/327* (2026.01); *H10W 80/701* (2026.01); *H10W 90/26* (2026.01); *H10W 90/297* (2026.01); *H10W 90/792* (2026.01)

(58) Field of Classification Search

CPC ............. H10W 90/792; H10W 80/701; H10W 80/721; H10W 80/732; H10W 80/102

See application file for complete search history.

(56) References Cited

U.S. PATENT DOCUMENTS

| | | | | |
|---|---|---|---|---|
| 11,094,653 | B2 * | 8/2021 | Wu | H10W 72/90 |
| 11,911,839 | B2 * | 2/2024 | Shah | B23K 20/02 |
| 12,119,315 | B2 * | 10/2024 | Chang | H10W 90/00 |
| 2017/0358553 | A1 * | 12/2017 | Kim | H10W 90/00 |
| 2019/0385982 | A1 * | 12/2019 | Lee | H10W 42/121 |
| 2021/0143115 | A1 * | 5/2021 | Wu | H10W 72/90 |
| 2021/0151406 | A1 * | 5/2021 | Kanda | H10W 72/019 |
| 2022/0336394 | A1 * | 10/2022 | Ishikawa | H10W 72/90 |
| 2023/0011840 | A1 * | 1/2023 | Chang | H10W 90/00 |

* cited by examiner

*Primary Examiner* — Mounir S Amer
*Assistant Examiner* — Alexander Belousov
(74) *Attorney, Agent, or Firm* — Dorsey & Whitney LLP

(57) ABSTRACT

A semiconductor device assembly is described that includes two semiconductor dies. The semiconductor dies each include a layer of dielectric material and a reservoir of conductive material located adjacent to openings in the layer of dielectric material. The opening at the layer of dielectric material of the first semiconductor die and the opening at the layer of dielectric material of the second semiconductor die are aligned to create an interconnect opening. The reservoirs of conductive material are heated to volumetrically expand the reservoirs of conductive material past one another such that they contact at respective non-horizontal surfaces to form an interconnect electrically coupling the semiconductor dies. In this way, a connected semiconductor device may be assembled.

8 Claims, 8 Drawing Sheets

100b

102

114

104

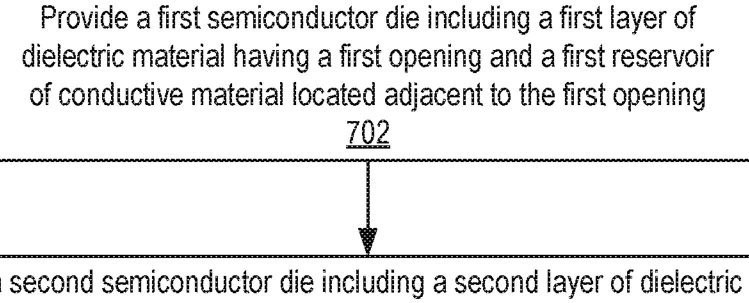

Provide a second semiconductor die including a second layer of dielectric material having a second opening corresponding to the first opening and a second reservoir of conductive material located adjacent to the second opening
704

Align the first semiconductor die and the second semiconductor die such that the first opening aligns with the second opening to create an interconnect opening
706

Heat the first reservoir of conductive material and the second reservoir of conductive material effective to cause the first reservoir of conductive material and the second reservoir of conductive material to volumetrically expand through the interconnect opening past one another such that a non-horizontal surface of the first reservoir of conductive material contacts a non-horizontal surface of the second reservoir of conductive material to form an interconnect electrically coupling the first semiconductor die and the second semiconductor die
708

*FIG. 7*

SEMICONDUCTOR DEVICE WITH VOLUMETRICALLY-EXPANDED SIDE-CONNECTED INTERCONNECTS

CROSS-REFERENCE TO RELATED APPLICATION(S)

The present application claims priority to U.S. Provisional Patent Application No. 63/401,684, filed Aug. 28, 2022, the disclosure of which is incorporated herein by reference in its entirety.

TECHNICAL FIELD

The present disclosure generally relates to semiconductor device assemblies, and more particularly relates to semiconductor devices with volumetrically expanded, non-horizontal interconnects.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIG. 7 illustrates an example method for fabricating a semiconductor device assembly in accordance with an embodiment of the present technology.

DETAILED DESCRIPTION

Semiconductor devices are integrated into many devices to implement memory cells, processor circuits, imager devices, and other functional features. As more applications for semiconductor devices are discovered, designers are tasked with creating improved devices that can perform a greater number of operations per second, store greater amounts of data, or operate with a higher level of security. To accomplish this task, designers continue to develop new techniques to increase the number of circuit elements on a semiconductor device without increasing the size of the device. This development, however, may not be sustainable due to various challenges that arise from designing semiconductor devices with high circuit density. Thus, additional techniques may be required to continue the growth in capability of semiconductor devices.

One such technique is the implementation of multiple semiconductor dies within a single package. These multiple dies may be stacked to increase the number of circuit elements within the package without increasing a footprint (e.g., horizontal area) of the device. Stacked semiconductor devices (e.g., three-dimensional interface (3DI) packaging solutions) are often implemented as a set of multiple semiconductor dies disposed on silicon wafers. Each of the multiple semiconductor dies may include metallization layers that provide various functionality. These semiconductor dies are physically and electronically connected to one another to enable electrical communication between the dies. Many solutions for connecting semiconductor dies, however, may be suboptimal for producing a reliable, well-connected semiconductor device. One such semiconductor device assembly is illustrated by way of example in FIGS. 1A and 1B.

Figures 1A, 1B:
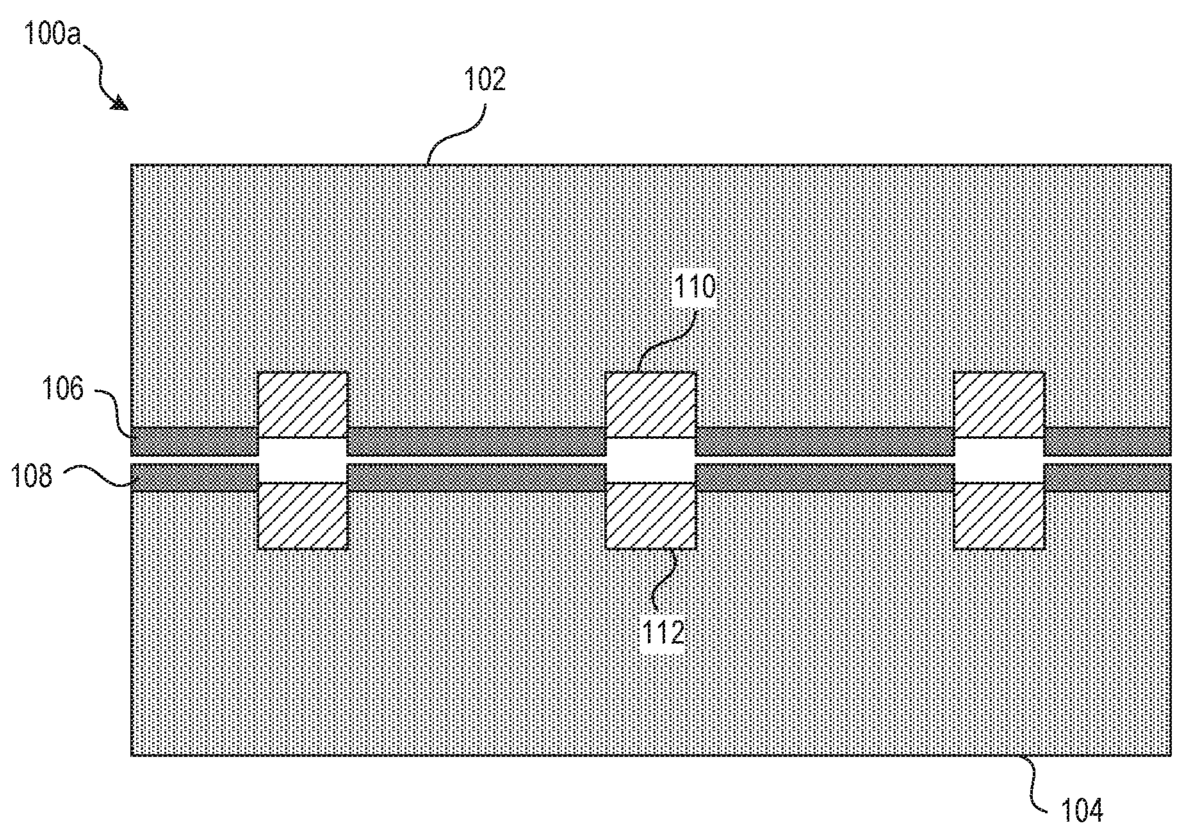
FIGS. 1A and 1B illustrate simplified schematic cross-sectional views of a series of fabrication steps for semiconductor device assemblies.

Beginning with FIG. 1A, a semiconductor device assembly 100*a* includes a semiconductor die 102 and a semiconductor die 104. The semiconductor die 102 may include a dielectric layer 106 at a bonding surface of the semiconductor die 102, and the semiconductor die 104 may include a dielectric layer 108 at a bonding surface of the semiconductor die 104. The dielectric layer 106 and the dielectric layer 108 may act as a passivated, outermost portion of the semiconductor dies that insulates circuitry and connections of the semiconductor dies. Conductive material 110 may be placed along portions of the dielectric layer 106 and conductive material 112 may be placed along portions of the dielectric layer 108. The conductive material 110 and the conductive material 112 may be recessed from the dielectric layer 106 and the dielectric layer 108, respectively, to form openings for the conductive material 110 and the conductive material 112 to expand into. In the semiconductor device assembly of FIG. 1A, the conductive material 110 and the conductive material 112 have a width substantially equal to a width of the openings created in the dielectric layer 106 and the dielectric layer 108 (e.g., within 0.1 microns, within 0.5 microns, within 1 micron, etc.). Similarly, the conductive material 110 and the conductive material 112 are substantially aligned (e.g., centered about the same lateral location within 0.1 microns, within 0.5 microns, within 1 micron, etc.).

The semiconductor die 102 and the semiconductor die 104 may be coupled (e.g., stacked) and electrically connected. Given the alignment of the conductive material 110 and the conductive material 112, the semiconductor device may be electrically connected by expanding the conductive material 110 and the conductive material 112 until a lower surface of the conductive material 110 contacts an upper surface of the conductive material 112. The coupling process may include heating the dielectric layer 106, the dielectric layer 108, the conductive material 110, and the conductive material 112. While the structures are heated, force may be applied to the semiconductor die 102 and the semiconductor die 104 to bring the dielectric layer 106 in contact with the dielectric layer 108 and cause the conductive material 110 and the conductive material 112 to volumetrically expand in a single dimension through the openings. The resulting semiconductor device assembly is illustrated by way of example in FIG. 1B.

FIG. 1B illustrates an electrically connected semiconductor device assembly 100*b*. The dielectric layer 106 and the dielectric layer 108 may bond to physically couple the semiconductor die 102 and the semiconductor die 104. The semiconductor die 102 and the semiconductor die 104 are connected through interconnects 114 (e.g., conductive structures) coupled to circuitry at the semiconductor die 102 and the semiconductor die 104. The interconnects 114 may be formed through expansion of the conductive material 110 and the conductive material 112 through the openings in the dielectric layers. The conductive material 110 and the conductive material 112 may expand by a specific amount such that a lower surface (e.g., horizontal surface) of the conductive material 110 contacts an upper surface (e.g., horizontal surface) of the conductive material 112, thereby enabling electrical signaling to pass from the conductive material 110 to the conductive material 112 and vice versa.

Semiconductor devices assembled through this process may be required to satisfy various design constraints. Specifically, the conductive material 110 and the conductive material 112 used to form the interconnects 114 may be required to be substantially aligned with one another, for example, along a same central axis as the openings. Thus, the location of the conductive material may be largely restricted and inhibit the implementation of some semiconductor device designs. Moreover, the conductive material 110 and the conductive material 112 may need to vertically expand by a same amount as the depths of the dielectric layer to ensure that the conductive material 110 and the conductive material 112 may contact to form the interconnects 114 but do not prevent the dielectric layers from contacting. For example, if the conductive material 110 or the conductive material 112 expands less than expected, voids may be present between the conductive materials, and the electrical connection between the semiconductor dies may be short-circuited. Alternatively, if the conductive material 110 or the conductive material 112 expands more than expected, the dielectric layers may separate, and the semiconductor device assembly may not be structurally supported, which in some cases can cause structural failure and result in short circuits between the semiconductor dies.

To address these drawbacks and others, various embodiments of the present application exploit the thermophysical properties of conductive material, such as copper. When heated, conductive material may expand in volume based on a coefficient of expansion. Given that this expansion may be predicted, semiconductor devices may be designed with reservoirs of conductive material located adjacent to vacancies to enable the conductive material to expand into these vacancies and create connective structures that couple the various circuit components in the semiconductor device. In doing so, a robust and well-connected semiconductor device may be assembled through the thermal expansion of conductive material.

For example, a semiconductor device assembly is described that includes two semiconductor dies. The semiconductor dies each include a layer of dielectric material and a reservoir of conductive material located adjacent to an opening in the layer of dielectric material. The opening at the dielectric layer of the first semiconductor die and the opening at the dielectric layer of the second semiconductor die are aligned to create an interconnect opening. The reservoirs of conductive material are heated to volumetrically expand the reservoirs of conductive material past one another such that they contact at respective non-horizontal surfaces to form an interconnect electrically coupling the semiconductor dies.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or a die-level substrate, or another die for die-stacking or 3DI applications.

A person having ordinary skill in the relevant art will recognize that suitable steps of the methods described herein can be performed at the wafer level or at the die level. Thus, although some examples may be illustrated or described with respect to dies or wafers, the technology disclosed herein may apply to dies or wafers. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 2A:
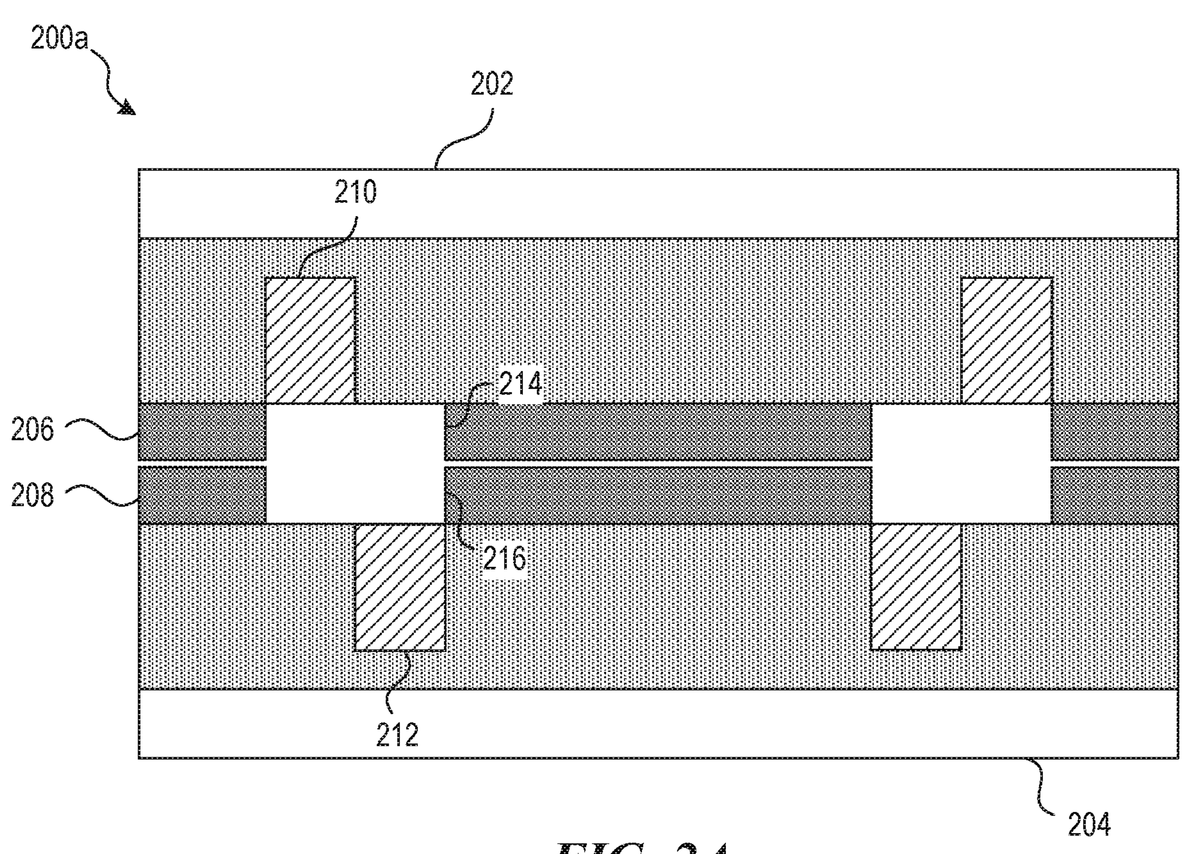
FIGS. 2A and 2B illustrate simplified schematic cross-sectional views of a series of fabrication steps for semiconductor device assemblies in accordance with an embodiment of the present technology.
Figure 2B:
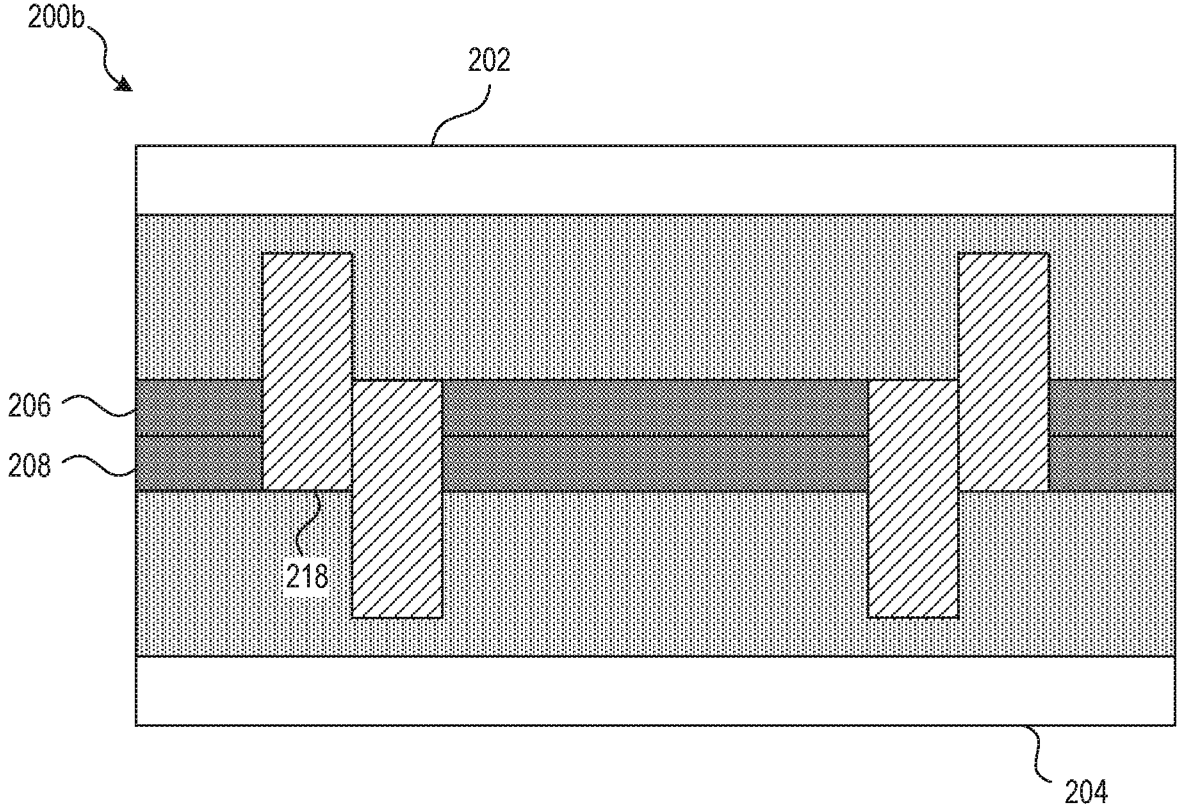

FIGS. 2A and 2B illustrate operations for fabricating a semiconductor device assembly in accordance with an embodiment of the present technology. Beginning with FIG. 2A, a semiconductor device assembly 200*a* that includes a semiconductor die 202 and a semiconductor die 204 is illustrated. The semiconductor die 202 includes a dielectric layer 206 that acts as a passivation layer to insulate circuitry and connections at the semiconductor die 202. The dielectric layer 206 may include dielectric material, for example, silicon oxide, silicon nitride, silicon carbide, or silicon carbon nitride. The dielectric layer 206 may be created through any appropriate technique, for example, oxidation or deposition. Conductive material or dielectric material may be disposed at a metallization layer between the dielectric layer 206 and the die substrate to implement traces, lines, vias, transistors, or other circuit elements within the semiconductor die 202. For example, layers of conductive material may be separated by layers of dielectric material (e.g., interlayer dielectric) to separate various circuit components. Similarly, the semiconductor die 204 includes a dielectric layer 208. The semiconductor die 204 may include a die substrate and a metallization layer having circuitry and dielectric layers between the die substrate and the dielectric layer 208. The semiconductor die 202 and the semiconductor die 204 may further include one or more reservoirs of conductive material 210 and one or more reservoirs of conductive material 212, respectively.

One or more openings 214 and one or more openings 216 may be implemented at the dielectric layer 206 and the dielectric layer 208, respectively. The reservoirs of conductive material 210 may be located adjacent to the openings 214, and the reservoirs of conductive material 212 may be located adjacent to the openings 216. Although illustrated as beneath the openings 214 and the openings 216, the reservoirs of conductive material may be located at least partially within the openings 214 or the openings 216 (e.g., recessed from a bonding surface of the dielectric layers). The openings 214 and the openings 216 may provide vacancies for the reservoirs of conductive material 210 and the reservoirs of conductive material 212 to expand into. Each of the openings 214 or the openings 216 may have a width that is thick enough to implement an interconnect at the openings 214 or the openings 216. For example, an opening designed for a power interconnect may be thicker than an opening designed for an input/output (I/O) interconnect to provide an interconnect with adequate cross-sectional area.

The reservoirs of conductive material 210 and the reservoirs of conductive material 212 may be located adjacent to the openings 214 and the openings 216, respectively. The reservoirs of conductive material 210 or the reservoirs of conductive material 212 may implement one or more contact pads exposed through the openings 214 and the openings 216, respectively, to couple the semiconductor dies. In aspects, the reservoir of conductive material 210 and the reservoir of conductive material 212 may be laterally offset (e.g., based on a vertical central axis) from one another or from the openings 214 and the openings 216, respectively. For example, a boundary of the reservoir of conductive material 210 and a boundary of the reservoir of conductive material 212 may be located at the same lateral location (e.g., the right boundary of the reservoir of conductive material 210 and the left boundary of the reservoir of conductive material 212). In some instances, this lateral location may be a centerline of the opening 214 or the opening 216. An additional boundary of the reservoir of conductive material 210 and an additional boundary of the reservoir of conductive material 212 may be located at different lateral locations (e.g., the left boundary of the reservoir of conductive material 210 and the right boundary of the reservoir of conductive material 212). In some cases, the reservoirs of conductive material 210 and the reservoirs of conductive material 212 may at least partially overlap one another laterally. In other instances, the reservoirs of conductive material 210 and the reservoirs of conductive material 212 may not overlap one another laterally.

As illustrated in FIG. 2A, the reservoir of conductive material 210 has a width less than the width of the opening 214, and the reservoir of conductive material 212 has a width less than the width of the opening 216. However, the reservoirs of conductive material 210 or the reservoirs of conductive material 212 may have a width that is less than, greater than, or equal to a width of the openings 214 or the openings 216. In this way, the width of the reservoirs of conductive material may not be constrained to the width of the openings, thereby reducing design constraints in the semiconductor device. Further, although illustrated as having the same width, the reservoirs of conductive material 210 and the reservoirs of conductive material 212 may have different widths. Moreover, although illustrated with rectangular cross sections, the reservoirs of conductive material 210 or the reservoirs of conductive material 212 may have any appropriately shaped cross section, for example, elliptical, rhomboidal, kite-shaped, or any other shape.

The openings 214 or the openings 216 may be created through any number of appropriate methods. For example, dielectric material may be deposited only around the openings 214 and the openings 216. Alternatively, the dielectric material may be deposited equally across the semiconductor dies, and the openings 214 and the openings 216 may be etched into the dielectric layer 206 and the dielectric layer 208, respectively. The openings 214 or the openings 216 may be designed to have a depth, which as a non-limiting example may be between 0.5 microns and 1 micron. The reservoir of conductive material 210 and the reservoir of conductive material 212 may similarly be designed with a thickness. The thickness may be determined to enable the reservoirs of conductive material to volumetrically expand through the openings and contact one another based on the width of the openings, the width of the reservoirs of conductive material, and a thermal expansion coefficient of the conductive material. As non-limiting examples, the thickness may be between 5 and 10 microns.

The semiconductor die 202 and the semiconductor die 204 may be aligned such that the openings 214 correspond to the openings 216. The openings 214 and the openings 216 may be aligned to create one or more interconnect openings at which interconnects coupling the semiconductor dies may be implemented. In aspects, the interconnect openings may expose the reservoirs of conductive material 210 and the reservoirs of conductive material 212. In some instances, the dielectric layer 206 and the dielectric layer 208 may be bonded such that the alignment of the semiconductor dies is ensured and the openings 214 and the openings 216 remain aligned. The dielectric layers may be bonded before or during the interconnect formation process.

In some instances, the die coupling and interconnect formation process may include creating a vacuum condition around the semiconductor die 202 and the semiconductor die 204. An inert gas may be applied to the dielectric layer 206 or the dielectric layer 208. The reservoirs of conductive material 210 and the reservoirs of conductive material 212 or the dielectric layer 206 and the dielectric layer 208 may be heated to alter properties of the dielectric material and the conductive material. For example, the dielectric material may become reactive to enable a direct bond between the dielectric layer 206 and the dielectric layer 208, and the reservoirs of conductive material may expand through the openings. Pressure may be applied to the semiconductor die 202 or the semiconductor die 204 to bond the dielectric layer 206 and the dielectric layer 208. The reservoirs of conductive material 210 and the reservoirs of conductive material 212 may extend through the interconnect openings and past one another. The reservoir of conductive material 210 and the reservoir of conductive material 212 may contact at non-horizontal surfaces (e.g., surfaces with a non-zero slope, vertical surface, side surface) to create the interconnects coupling the semiconductor dies. The resulting semiconductor device assembly is illustrated by way of example in FIG. 2B.

FIG. 2B illustrates an example semiconductor device assembly 200*b* that includes the semiconductor die 202 mounted to the semiconductor die 204. In some cases, the dielectric layer 206 may bond to the dielectric layer 208 to mechanically couple the semiconductor dies. The semiconductor dies may be bonded active side-to-active side, back side-to-back side, or active side-to-back side. The reservoirs of conductive material 210 and the reservoirs of conductive material 212 may extend through the interconnect openings and past one another such that respective non-horizontal or substantially non-horizontal surfaces (e.g., surfaces with a slope having an absolute value greater than 0.05, 0.1, 0.15, 0.2, etc.) contact one another to form the interconnects 218 electrically coupling the semiconductor die 202 and the semiconductor die 204. In contrast to the interconnects 114 connected at horizontal surfaces illustrated in FIG. 1B, the interconnects 218 may be laterally connected through non-horizontal surfaces.

When connected, a first portion of the reservoirs of conductive material 210 may be located adjacent to the openings 214, and a second portion of the reservoirs of conductive material 210 may extend through the openings 214 or the openings 216. Similarly, a first portion of the reservoirs of conductive material 212 may be located adjacent to the openings 216, and a second portion of the reservoirs of conductive material 212 may extend through the openings 214 or the openings 216. The second portions of the reservoirs of conductive material may extend past one another such that non-horizontal surfaces of the second portions contact one another to form laterally connected interconnects. In aspects, the second portions of the reservoirs of conductive material may extend past one another by an amount that enables the second portions of the reservoirs of conductive material 210 and the second portions of the reservoirs of conductive material 212 to contact enough to form the interconnects 218. For example, the second portions of the reservoirs of conductive material may extend past one another by 5 percent, 10 percent, 15 percent, 25 percent, 50 percent, 75 percent, or 100 percent of the total expansion of the reservoirs of conductive material 210 or the reservoirs of conductive material 212. Moreover, the second portions of the reservoirs of conductive material may extend past one another by 5 percent, 10 percent, 15 percent, 25 percent, 50 percent, 75 percent, or 100 percent of the total height of the interconnects 218.

This semiconductor device assembly 200*b* may have multiple advantages over the design illustrated by way of example in FIG. 1B. For example, the laterally connected interconnects 218 may provide a larger surface for the reservoirs of conductive material 210 and the reservoirs of conductive material 212 to contact. Additionally, the design may be robust to deviations in the expansion of the conductive material. For example, the reservoirs of conductive material 210 and the reservoirs of conductive material 212 may still contact even if the conductive material expands less than expected due to the vertical contact. Moreover, the interconnect opening may be designed with excess space to prevent the semiconductor dies from separating even if the conductive material expands by a greater amount than expected. The design is also flexible to various locations of the reservoir of conductive material, thereby reducing design constraints in the design process and enabling a wider variety of designs.

Figure 3A:
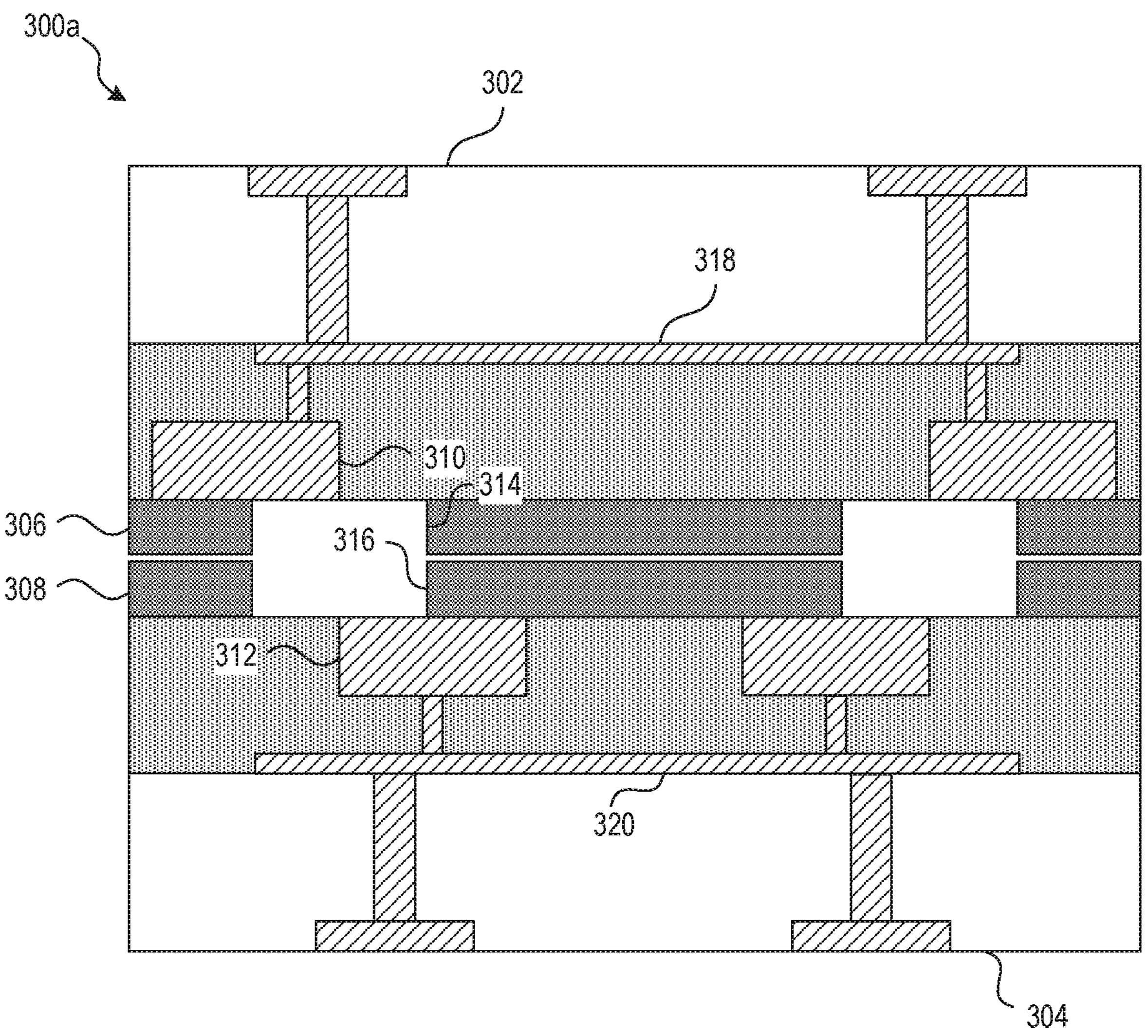
FIGS. 3A and 3B illustrate simplified schematic cross-sectional views of a series of fabrication steps for semiconductor device assemblies in accordance with an embodiment of the present technology.
Figure 3B:
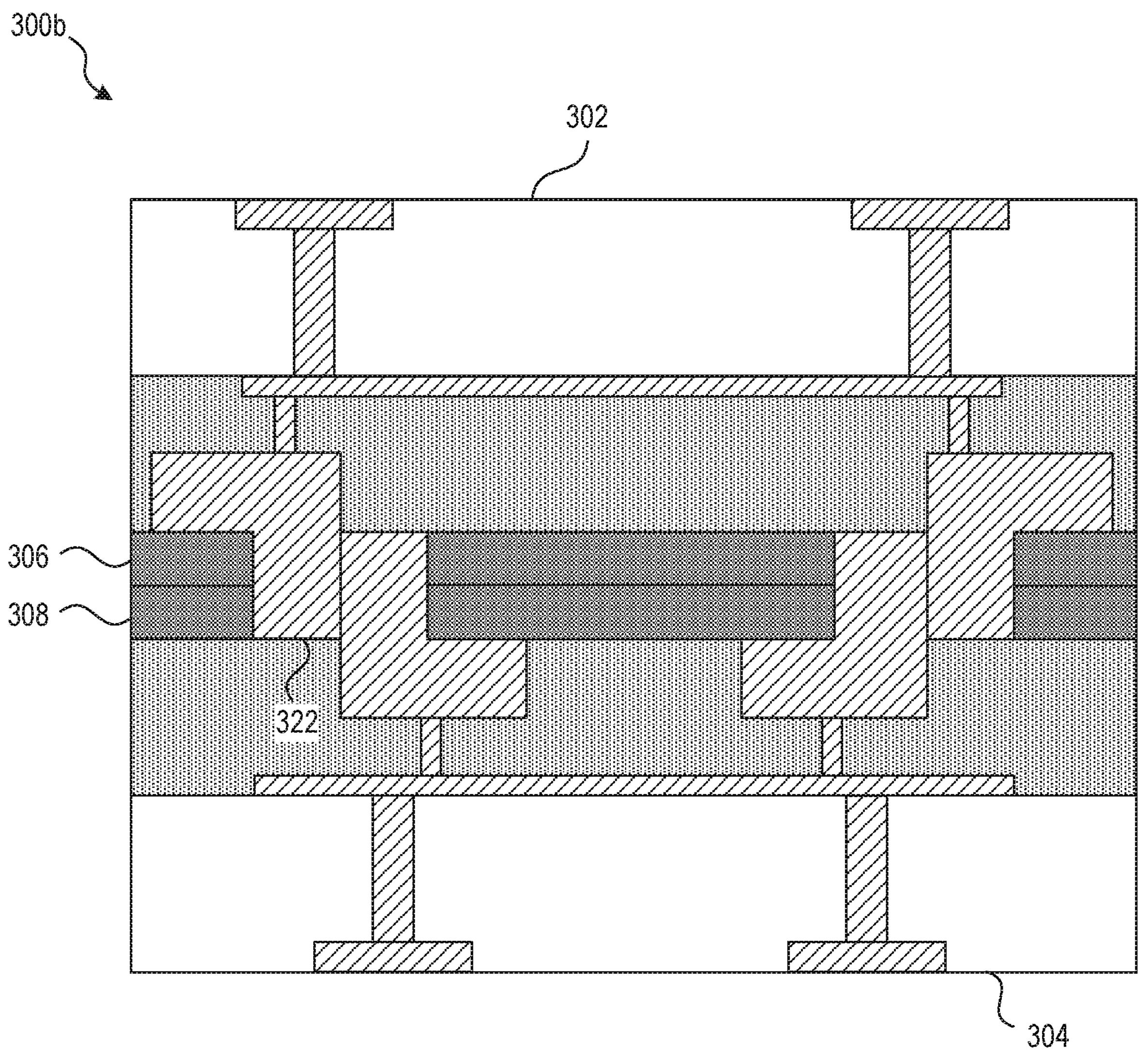

FIGS. 3A and 3B illustrate operations for fabricating a semiconductor device assembly in accordance with an embodiment of the present technology. As illustrated with reference to FIG. 3A, a semiconductor device assembly 300*a* includes a semiconductor die 302 and a semiconductor die 304. The semiconductor die 302 includes a dielectric layer 306 and a reservoir of conductive material 310 with various circuitry 318, including vias, traces, through-silicon vias (TSVs), and contact pads coupled therewith. The semiconductor die 304 similarly includes a dielectric layer 308 and a reservoir of conductive material 312 with various circuitry 320 coupled therewith. The reservoir of conductive material 310 and the reservoir of conductive material 312 are implemented adjacent to openings 314 and openings 316 at the dielectric layer 306 and the dielectric layer 308, respectively.

In contrast to the reservoirs of conductive material illustrated in FIGS. 2A and 2B, the reservoir of conductive material 310 and the reservoir of conductive material 312 are laterally offset from the openings 314 and the openings 316. In this way, a portion of the reservoir of conductive material 310 and a portion of the reservoir of conductive material 312 are not directly adjacent to the openings 314 and the openings 316. For example, a portion of the reservoir of conductive material 310 is located directly above the openings 314 and a portion of the reservoir of conductive material 310 is located directly above dielectric material in the dielectric layer 306. By enabling the reservoir of conductive material 310 and the reservoir of conductive material 312 to be offset from the openings 314 and the openings 316, the semiconductor device may be designed with fewer constraints.

The reservoir of conductive material 310 may connect to circuitry 318 in the semiconductor die 302. The circuitry 318 may include one or more vias that connect the reservoir of conductive material 310 to various traces, transistors, or other circuitry in the semiconductor die 302. The traces may connect to one or more TSVs that couple to contact pads exposed at a surface of the semiconductor die 302 to enable external connections to additional dies or to a printed circuit board (PCB). As a result, electrical signals may be carried from the reservoir of conductive material 310 to the contact pads at the upper surface or vice versa, and the die circuitry may perform operations using these signals. The reservoir of conductive material 312 may similarly connect to circuitry 320 that provides similar functionality.

The semiconductor die 302 and the semiconductor die 304 may be coupled to one another to enable electrical communication between the reservoir of conductive material 310 and any circuit components coupled therewith and the reservoir of conductive material 312 and any circuit components connected therewith. Given that the reservoirs of conductive material are offset from the openings, the reservoirs of conductive material may expand in more than one dimension when the conductive material is heated. For example, portions of the reservoirs of conductive material that are located adjacent to the openings may expand vertically through the openings, whereas portions of the reservoirs located directly adjacent to dielectric material may expand laterally and force more conductive material through the openings. The resulting semiconductor device assembly is illustrated by way of example in FIG. 3B.

FIG. 3B illustrates an example semiconductor device assembly 300*b* that includes the semiconductor die 302 mounted to the semiconductor die 304. The dielectric layer 306 and the dielectric layer 308 may couple through a direct bond (e.g., dielectric bond) to mechanically couple the semiconductor dies. The semiconductor die 302 and the semiconductor die 304 electrically couple through interconnects 322 formed from reservoirs of conductive material. Given that the reservoirs of conductive material may couple to circuitry at the respective semiconductor dies, electrical signals may be transmitted from the semiconductor die 302 and any circuitry coupled therewith (e.g., another semiconductor die) to the semiconductor die 304 and any circuitry coupled therewith (e.g., a PCB) and vice versa.

Although illustrated as being used to create interconnects between multiple dies, the reservoirs of conductive material may be expanded to create interconnects internal to the semiconductor die. Specifically, the reservoirs of conductive material may be expanded through internal openings to form internal circuitry. For example, reservoirs of conductive material may be expanded between layers of routing circuitry in the semiconductor die to form interconnects connecting multiple circuit components. In aspects, these interconnects may include vias, traces, or any other connective element.

Figure 4A:
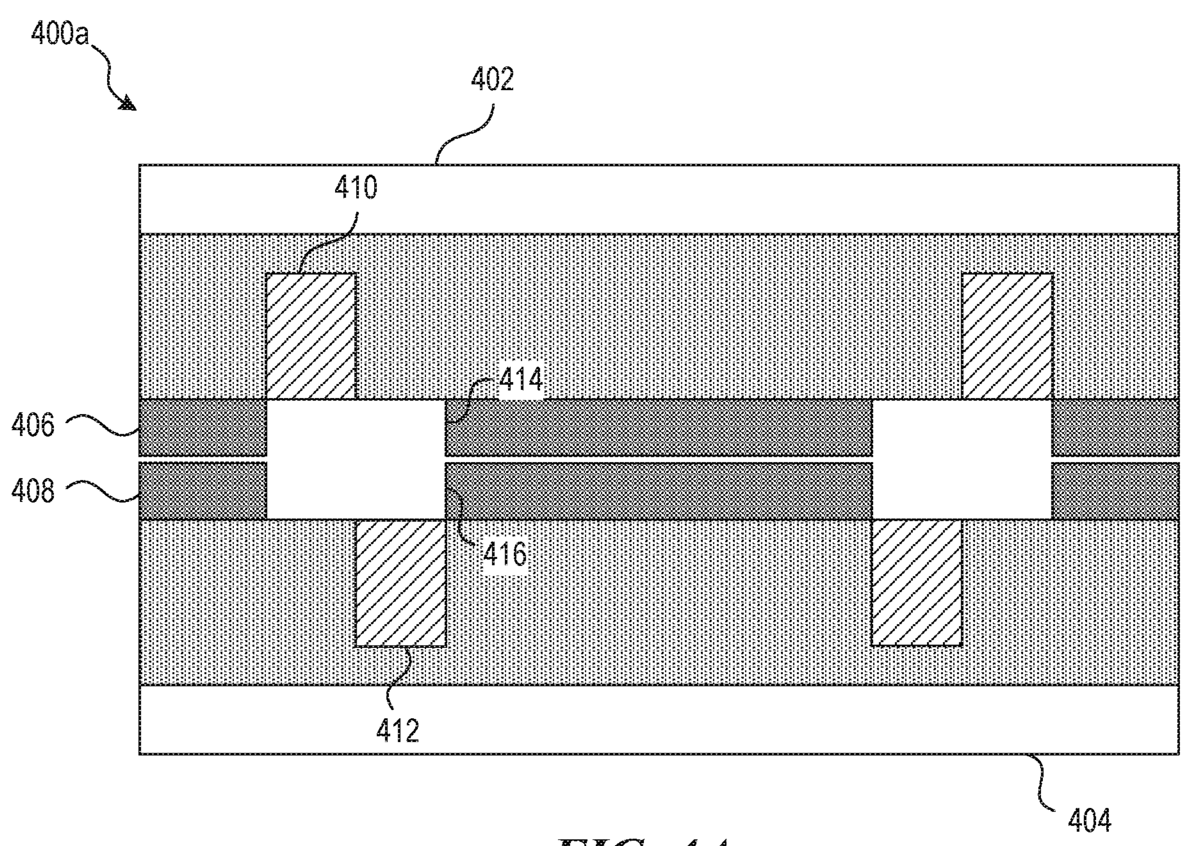
FIGS. 4A and 4B illustrate simplified schematic cross-sectional views of a series of fabrication steps for semiconductor device assemblies in accordance with an embodiment of the present technology
Figure 4B:
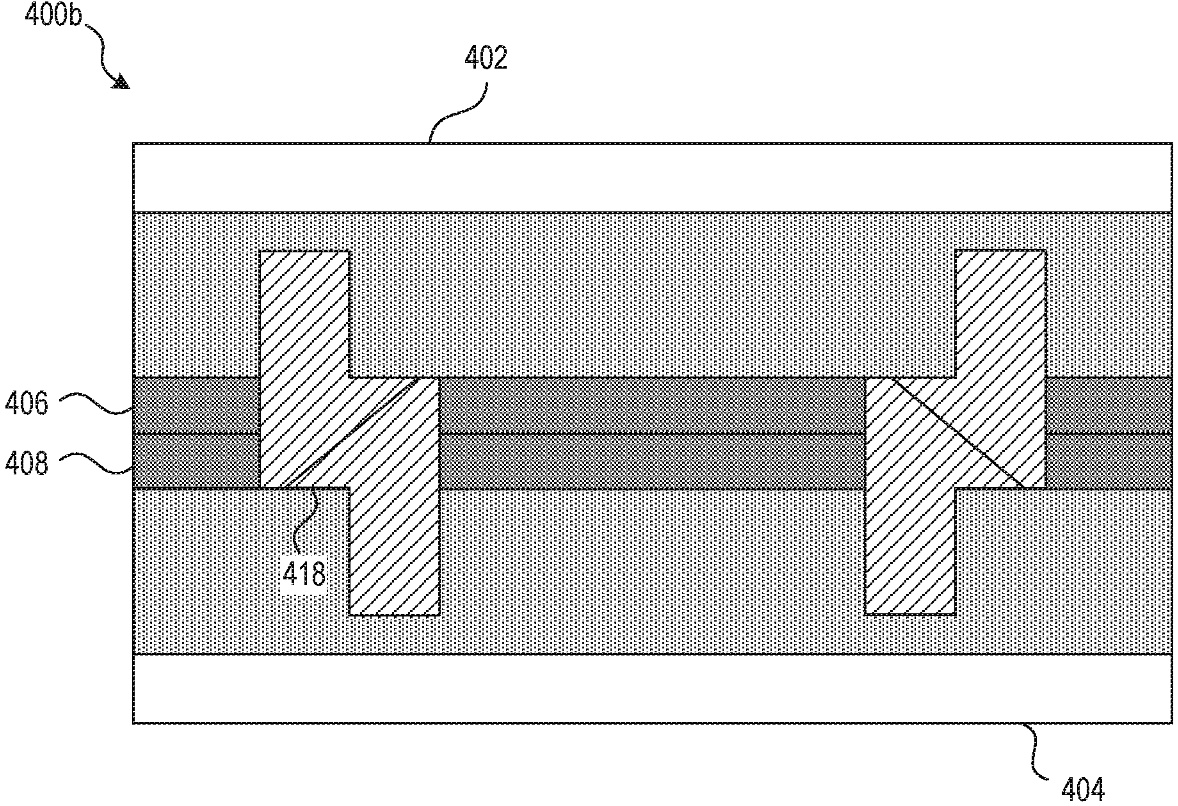

FIGS. 4A and 4B illustrate operations for fabricating a semiconductor device assembly in accordance with an embodiment of the present technology. Specifically, FIG. 4A illustrates a semiconductor die 402 and a semiconductor die 404. The semiconductor die 402 and the semiconductor die 404 include a dielectric layer 406 and a dielectric layer 408, respectively. Reservoirs of conductive material 410 and reservoirs of conductive material 412 are disposed adjacent to openings 414 and openings 416 in the semiconductor die 402 and the semiconductor die 404, respectively. The dielectric layer 406 and the dielectric layer 408 may bond, and the reservoirs of conductive material 410 and the reservoirs of conductive material 412 may expand to form interconnects 418, as illustrated in FIG. 4B. Specifically, the reservoirs of conductive material 410 expand through the openings 414 both vertically and horizontally. The reservoirs of conductive material 412 may expand similarly through the openings 416. In doing so, a sloped, non-horizontal surface may be formed at the reservoirs of conductive material 410 and the reservoirs of conductive material 412. The reservoirs of conductive material 410 and the reservoirs of conductive material 412 may continue to expand until they contact at respective non-horizontal surfaces to form the interconnects 418.

Figure 5:
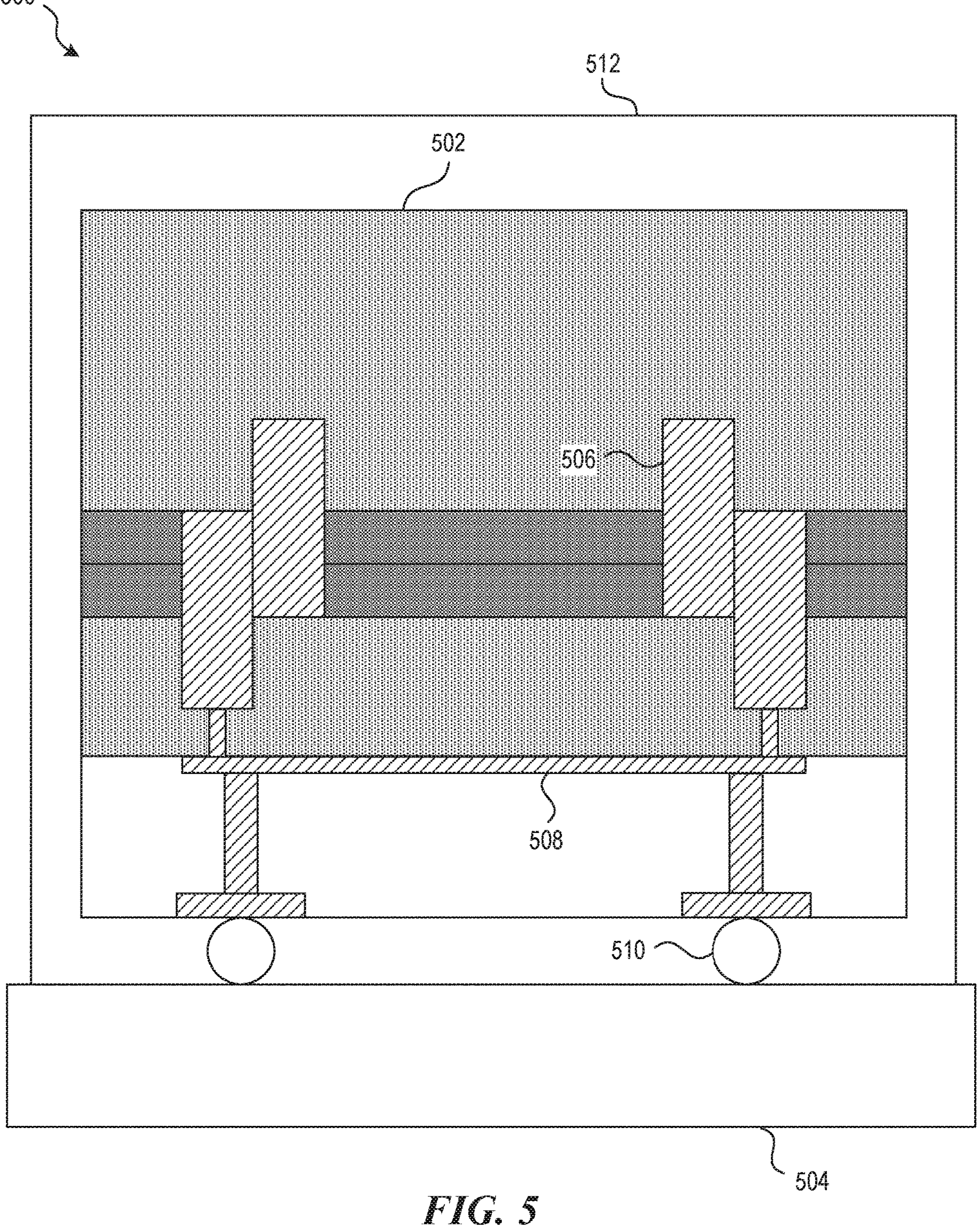
FIG. 5 illustrates a simplified schematic cross-sectional view of a semiconductor device assembly in accordance with an embodiment of the present technology.

FIG. 5 illustrates a simplified schematic cross-sectional view of a semiconductor device assembly 500 in accordance with an embodiment of the present technology. The semiconductor device assembly 500 includes stacked semiconductor dies 502 assembled onto a package-level substrate 504. The package-level substrate 504 may include a PCB, an interposer, or one or more additional dies. The stacked semiconductor dies 502 may mechanically couple through direct bonds between the dielectric layers of the semiconductor dies. The stacked semiconductor dies 502 may electrically couple (e.g., and mechanically couple) through interconnects 506, which are formed by annealing one or more reservoirs of conductive material to volumetrically expand the conductive material through openings in the dielectric layers. The interconnects 506 may couple to various circuitry 508 to provide various connectivity and functionality to the semiconductor device. For example, a base die may include vias that couple the interconnects 506 to traces and other circuitry within the base die. The traces may couple to one or more TSVs that extend to contact pads to provide external connectivity to the stacked semiconductor dies 502. For example, connective structures 510 (e.g., solder balls, copper pillars, etc.) couple the contact pads implemented at the base die and contact pads implemented at the substrate 504. The contact pads at the substrate 504 may couple to various routing circuitry that provides connectivity to one or more internal or external circuit components. Once assembled, the stacked semiconductor dies 502 may be at least partially encapsulated by an encapsulant 512 to protect them from environmental factors (e.g., moisture, particulates, static electricity, and physical impact).

Although in the foregoing example embodiment semiconductor device assemblies have been illustrated and described as including a particular number of semiconductor dies, in other embodiments assemblies can be provided with more or fewer semiconductor dies. For example, the two-die semiconductor devices illustrated in FIGS. 2 through 5 could be replaced with, e.g., a vertical stack of semiconductor devices, a plurality of semiconductor devices, mutatis mutandis. Similarly, the interconnects need not be created between two dies. Instead, reservoirs of conductive material may be used to form circuitry internal to a semiconductor die that electrically couples multiple circuit components.

In accordance with one aspect of the present disclosure, the semiconductor devices illustrated in the assemblies of FIGS. 2-5 could be memory dies, such as dynamic random-access memory (DRAM) dies, NOT-AND (NAND) memory dies, NOT-OR (NOR) memory dies, magnetic random-access memory (MRAM) dies, phase change memory (PCM) dies, ferroelectric random-access memory (FeRAM) dies, static random-access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 6:
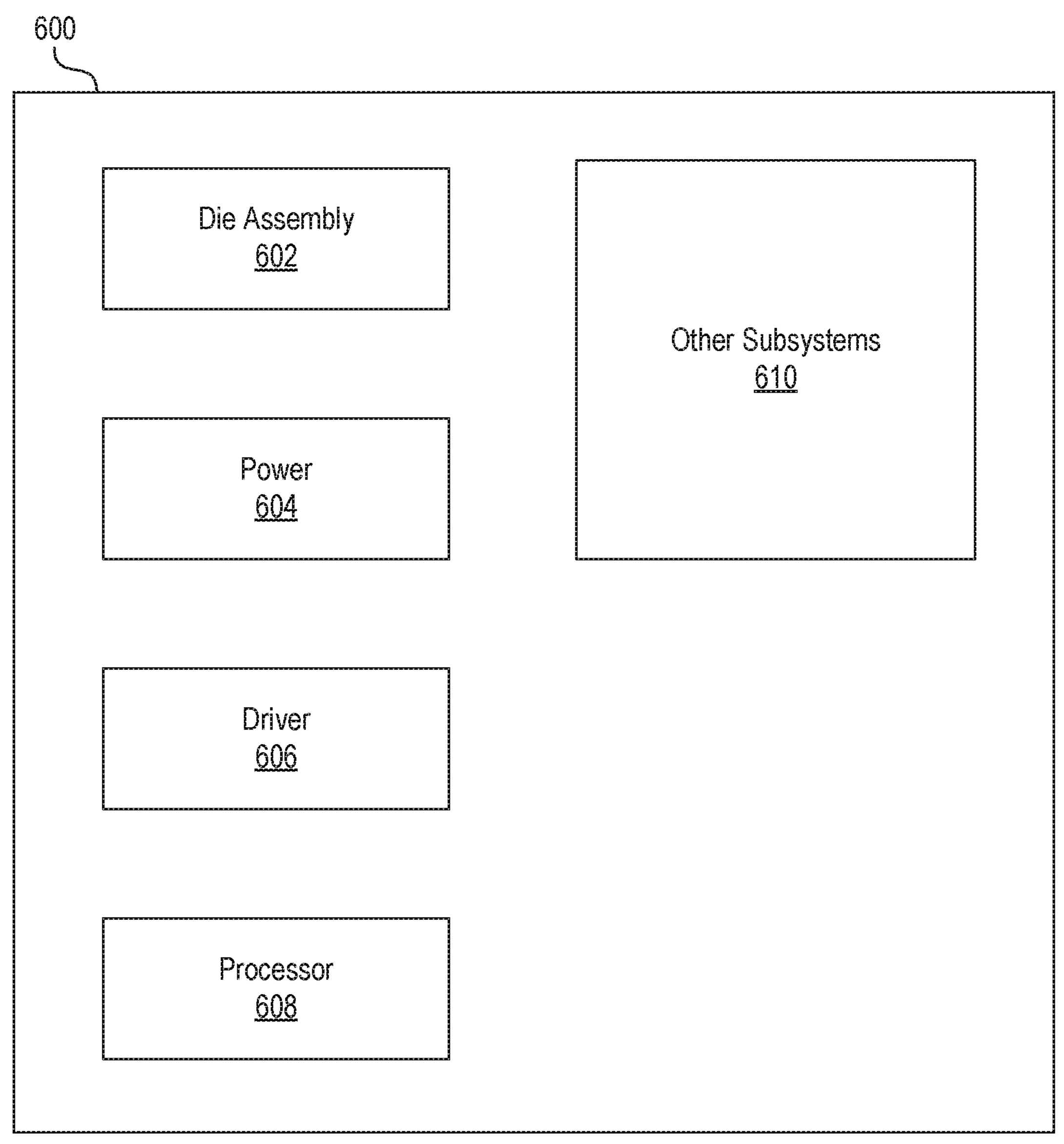
FIG. 6 illustrates a schematic view showing a system that includes a semiconductor device assembly configured in accordance with an embodiment of the present technology.

Any one of the semiconductor devices and semiconductor device assemblies described above with reference to FIGS. 2-5 can be incorporated into any of a myriad of larger and/or more complex systems, a representative example of which is system 600 shown schematically in FIG. 6. The system 600 can include a semiconductor device assembly 602 (e.g., or a discrete semiconductor device), a power source 604, a driver 606, a processor 608, and/or other subsystems or components 610. The semiconductor device assembly 602 can include features generally similar to those of the semiconductor devices described above with reference to FIGS. 2-5. The resulting system 600 can perform any of a wide variety of functions, such as memory storage, data processing, and/or other suitable functions. Accordingly, representative systems 600 can include, without limitation, handheld devices (e.g., mobile phones, tablets, digital readers, and digital audio players), computers, vehicles, appliances, and other products. Components of the system 600 may be housed in a single unit or distributed over multiple, interconnected units (e.g., through a communications network). The components of the system 600 can also include remote devices and any of a wide variety of computer-readable media.

FIG. 7 illustrates an example method 700 for fabricating a semiconductor device assembly in accordance with an embodiment of the present technology. The method 700 may, for illustrative purposes, be described by way of example with respect to features, components, or elements of FIGS. 2-6. Although illustrated in a particular configuration, one or more operations of the method 700 may be omitted, repeated, or reorganized. Additionally, the method 700 may include other operations not illustrated in FIG. 7, for example, operations detailed in one or more other methods described herein.

At 702, a first semiconductor die 202 is provided. The first semiconductor die 202 includes a first dielectric layer 206 having an opening 214. The first semiconductor die 202 further includes a reservoir of conductive material 210 located adjacent to the opening 214. A boundary of the reservoir of conductive material 210 may correspond to a first lateral location. In some instances, the first lateral location may be a centerline of the reservoir of opening 214. The reservoir of conductive material 210 may have an additional boundary at a second lateral location. In some cases, the reservoir of conductive material 210 may be at least partially laterally offset from the opening 214. The opening 214 may have a width greater than a width of the reservoir of conductive material 210.

At 704, a second semiconductor die 204 is provided. The second semiconductor die 204 includes a dielectric layer 208 having an opening 216 corresponding to the opening 214 at the dielectric layer 206. The second semiconductor die 204 may include a reservoir of conductive material 212 located adjacent to the second opening 216. The reservoir of conductive material 212 may have a boundary corresponding to the first lateral location and an additional boundary at a third lateral location that is different from the second lateral location. In this way, the reservoir of conductive material 210 and the reservoir of conductive material 212 may be laterally offset from one another. The first lateral location may correspond to a centerline of the opening 216 or to a centerline of an interconnect opening created from the opening 214 and the opening 216.

At 706, the first semiconductor die 202 and the second semiconductor die 204 are aligned such that the opening 214 aligns with the opening 216 to create an interconnect opening. In aspects, the method 700 may further include mounting the first semiconductor die 202 on the second semiconductor die 204. A bond may be created between the dielectric layer 206 and the dielectric layer 208 to mechanically couple the semiconductor dies. The bond may be created before, during, or after forming an interconnect 218 between the semiconductor dies.

At 708, the reservoir of conductive material 210 and the reservoir of conductive material 212 may be heated. The heating may cause the reservoir of conductive material 210 and the reservoir of conductive material 212 to volumetrically expand through the interconnect opening past one another such that a non-horizontal surface of the reservoir of conductive material 210 contacts the reservoir of conductive material 212 to form an interconnect 218 electrically coupling the first semiconductor die 202 and the second semiconductor die 204. In some instances, the reservoir of conductive material 210 and the reservoir of conductive material 212 may contact one another at the first lateral location (e.g., a centerline of the interconnect channel) when the reservoirs of conductive materials are expanded. In general, however, performing the method 700 may fabricate a robust and well-connected semiconductor device.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of making a semiconductor device assembly, comprising:
- providing a first semiconductor die including:
  - a first layer of dielectric material having a first opening; and
  - a first reservoir of conductive material located adjacent to the first opening;
- providing a second semiconductor die including:
  - a second layer of dielectric material having a second opening corresponding to the first opening; and
  - a second reservoir of conductive material located adjacent to the second opening;
- aligning the first semiconductor die and the second semiconductor die such that the first opening aligns with the second opening to create an interconnect opening; and
- heating the first reservoir of conductive material and the second reservoir of conductive material configured to cause the first reservoir of conductive material and the second reservoir of conductive material to volumetrically expand through the interconnect opening past one another such that a non-horizontal surface of the first reservoir of conductive material contacts a non-horizontal surface of the second reservoir of conductive material to form an interconnect electrically coupling the first semiconductor die and the second semiconductor die.

2. The method of claim 1, wherein:

a first boundary of the first reservoir of conductive material is located at a first lateral location; and a second boundary of the second reservoir of conductive material is located at the first lateral location.

3. The method of claim 2, wherein:

a third boundary of the first reservoir of conductive material is located at a second lateral location; and a fourth boundary of the second reservoir of conductive material is located at a third lateral location different from the second lateral location.

4. The method of claim 2, wherein the non-horizontal surface of the first reservoir of conductive material contacts the non-horizontal surface of the second reservoir of conductive material at the first lateral location when the first reservoir of conductive material and the second reservoir of conductive material are volumetrically expanded.

5. The method of claim 2, wherein the first lateral location corresponds to a centerline of the interconnect opening.

6. The method of claim 1, wherein the first reservoir of conductive material is at least partially laterally offset from the first opening.

7. The method of claim 1, wherein:

the first reservoir of conductive material has a first width; and the first opening has a second width greater than the first width.

8. The method of claim 1, further comprising creating a bond between the first layer of dielectric material and the second layer of dielectric material.

* * * * *